(12) United States Patent
DeYoung et al.

(10) Patent No.: US 6,919,167 B2
(45) Date of Patent: Jul. 19, 2005

(54) POSITIVE TONE LITHOGRAPHY IN CARBON DIOXIDE SOLVENTS

(75) Inventors: James DeYoung, Durham, NC (US); James B. McClain, Raleigh, NC (US)

(73) Assignee: MiCell Technologies, Raleigh, NC (US)

( * ) Notice: Subject to any disclaimer, the term of this patent is extended or adjusted under 35 U.S.C. 154(b) by 90 days.

(21) Appl. No.: 10/294,222

(22) Filed: Nov. 14, 2002

(65) Prior Publication Data

US 2004/0096783 A1 May 20, 2004

(51) Int. Cl.$^7$ ................................................. G03F 7/36
(52) U.S. Cl. ..................................... 430/313; 430/331
(58) Field of Search ................................ 430/322, 326, 430/331, 311, 313; 510/175

(56) References Cited

U.S. PATENT DOCUMENTS

| | | | |
|---|---|---|---|
| 5,532,106 | A | 7/1996 | Fréchet et al. |
| 5,532,113 | A | 7/1996 | Fréchet et al. |
| 5,536,616 | A | 7/1996 | Fréchet et al. |
| 5,545,509 | A | 8/1996 | Cameron et al. |
| 5,648,196 | A | 7/1997 | Fréchet et al. |
| 5,665,527 | A | 9/1997 | Allen et al. |
| 6,001,418 | A | 12/1999 | DeSimone et al. |
| 6,083,565 | A | 7/2000 | Carbonell et al. |
| 6,379,874 | B1 | 4/2002 | Ober et al. |
| 6,737,215 | B2 * | 5/2004 | Dammel et al. .......... 430/270.1 |
| 2002/0119398 | A1 | 8/2002 | DeSimone et al. |
| 2003/0047533 | A1 * | 3/2003 | Reid et al. ..................... 216/24 |
| 2004/0096779 | A1 | 5/2004 | DeSimone .................. 430/313 |

OTHER PUBLICATIONS

K.Jackson et al.; "Surfactants and Microemulsions in Supercritical Fluids" ; in Supercritical fluid cleaning;ed.J.Hardy (Noyes) 1998, ch.5 pp. 87–120.*
Sunderarajan et al. "Supercritical CO2 processing for submicron imaging of fluoropolymers", Chem Mater, v12, (2000) pp. 41–48.*

Cameron, James F., et al., *Photogeneration of amines from u–keto carbamates: design and preparation of photoactive compounds*, J. Chem. Soc., 1:2429–2442 (1997).
Fréchet , Jean M.J.,et al., *Photogenerated Base in Resist and Imaging Materials: Design of Functional Polymers Susceptible to Base Catalyzed Decarboxylation*, Chem. Mater., 9: 2887–2893 (1997).
Havard, Jennifer M., et al., *Functional Design of Environmentally enhanced Water–Soluble Positive–Tone Photoresists*, Polym. Mat. Sci. Eng., 77:424–5 (1997).
Pham, Victor Q., et al., *Positive–Tone Resist for Supercritical $CO_2$ Processing*, Polymer Preprints, 43(2): 885–6 (2002).
Urankar, Edward J., et al., *Photogenerated Base in Polymer Curing and Imaging: Design of Reactive Styrenic Copolymers Susceptible to a Base–Catalyzed β–Elimination*, Journal of Polymer ScienceJournal of Polymer Science: Part A: Polymer Chemistry, 35:3543–3552 (1997).
Urankar, Edward J., et al., *Photogenerated Base in Polymer Curing and Imaging: Cross–Linking of Base–Sensitive Polymers Containing Enolizable Pendant Groups*, Chem. Mater., 9: 2861–2868 (1997).
Urankar, Edward J., et al., *Base–Sensitive Polymers as Imaging Materials: Radiation–Induced β–Elimination To Yield Poly(4–hydroxystyrene)*, Macromolecules, 30: 1304–1310 (1997).
International Search Report for PCT/US03/36670; Date of Mailing Jan. 10, 2005.

* cited by examiner

Primary Examiner—Kathleen Duda
(74) Attorney, Agent, or Firm—Myers, Bigel, Sibley & Sajovec, PA.

(57) ABSTRACT

A method for carrying out positive tone lithography with a carbon dioxide solvent system is carried out by (a) providing a substrate having a polymer resist layer formed thereon; (b) exposing at least one portion of the polymer resist layer to radiant energy to form at least one light field region in the polymer resist layer; and then (c) contacting the polymer resist layer to a carbon dioxide solvent system, the solvent system preferably comprising a polar group, under conditions in which the at least one light field region is preferentially removed.

32 Claims, No Drawings

POSITIVE TONE LITHOGRAPHY IN CARBON DIOXIDE SOLVENTS

FIELD OF THE INVENTION

The present invention concerns lithographic methods, particularly positive tone or light field lithographic methods, which may be used to form patterned regions on substrates such as microelectronic substrates.

BACKGROUND OF THE INVENTION

In positive tone (or "light field") lithography, the area of photoresist film that is developed (removed as a result of the development process) is that which is exposed to the incident radiation. This lithographic method exemplified by chemically amplified resists mandates a radiation-induced transition in exposed areas of the photoresist that make the exposed region preferentially soluble in the development solution. The solid-phase polymer chemistry for creating preferential solvation of exposed polymer is typically carried out by (a) creating polar functional groups in the polymer through reactions such as the deprotection of a carboxylate group, as in acid-catalyzed chemically amplified resists, or (b) decreasing the photoresist polymer chain length through degradation of the photoresist polymer (e.g., e-beam lithography) or scission of selected chemical bonds in the polymer. In the case of bond scission, the new end-groups on the smaller polymers are predominantly polar.

Positive tone lithographic techniques are simpler and more common for today's aqueous base developers, and encompass an overwhelming percentage of materials in use for lithography today.

In carbon dioxide solvent systems, low-polarity polymer species such as photoresist polymers are more soluble than polar polymers. This provides an obvious pathway for negative tone image development, as seen in U.S. Pat. No. 5,665,527 to Allen and U.S. Pat. No. 6,379,874 to Ober. However, the traditional photoresist chemical transition of non-polar to polar species (which polar species are less soluble in carbon dioxide solvents) creates a contradiction and challenge in establishing a photoresist chemistry and image development technology for a positive tone lithography in carbon dioxide solvent systems. Accordingly, there is a need for new ways to carry out positive tone lithography in carbon dioxide solvent systems.

SUMMARY OF THE INVENTION

A method for carrying out positive tone lithography with a carbon dioxide solvent system is described herein. The method comprises the steps of:

(a) providing a substrate, said substrate having a polymer resist layer formed thereon;

(b) exposing at least one portion of said polymer resist layer to radiant energy to thereby form at least one light field region in said polymer resist layer while concurrently maintaining at least one portion of said polymer layer unexposed to said radiant energy to thereby form at least one dark field region in said polymer resist layer; and (c) contacting said polymer resist layer to a carbon dioxide solvent system, said solvent system comprising a polar group, under conditions in which said at least one light field region is preferentially removed from said substrate by said carbon dioxide solvent system as compared to said at least one dark field region.

In one embodiment of the invention, the polarity of the polymer resist in the light-field region is increased by the radiant energy. In another embodiment of the invention, the molecular weight of the polymer resist in the light-field region is decreased by the radiant energy. Of course; the two processes (increased polarity, decreased molecular weight) may occur concurrently with one another upon exposure of the polymer resist to radiant energy.

Note that even most non-polar polymers are not highly soluble in carbon dioxide, and that any solubility they do exhibit tends to be sensitive to molecular weight. The allows the variable nature of the carbon dioxide solvent system (temperature, pressure, etc.) to "tune" conditions where polymers will become soluble, and may provide exceptional contrast and control over very small features in the light-field when chain-length modifications are used to provide the chemical differentiation in lithography.

DETAILED DESCRIPTION OF THE PREFERRED EMBODIMENTS

The present invention is explained in greater detail in the specification set forth below. Applicants specifically intend that the disclosures of all United States patent references that are cited herein be incorporated herein by reference in their entirety.

1. Substrates and Coatings.

The present invention may be carried out on a variety of substrates including but not limited to semiconductors such as gallium arsenide, silicon wafers containing process residue, transient and non-transient layers applied in the manufacturing of semiconductor devices such as integrated circuits, sapphire wafers, microelectromechanical devices (MEMs), and optoelectronic devices.

Photochemically active resists may be applied by spin coating from solvent or other suitable technique such as spray coating or doctor blading. The resist typically comprises a polymeric material, and may be a positive-acting resist or a negative-acting resist. As discussed above, positive-acting resists are currently preferred. Any suitable resist composition can be used in conjunction with the present invention, including but not limited to those described in U.S. Pat. Nos. 6,165,678; 6,103,866; 6,042,997; 5,989,776; 5,922,518; 5,866,304; 5,492,793; 5,443,690; 5,071,730; 4,980,264; and 4,491,628.

For example, in some embodiments the resist composition includes a photosensitive acid generator. Upon exposure to radiation, the radiation-sensitive acid generator generates a strong acid. A variety of photosensitive acid generators can be used in the composition. Generally, suitable acid generators have a high thermal stability (preferably to temperatures greater than 160° C.) so they are not degraded during pre-exposure processing. Suitable acid generators include ionic iodonium sulfonates, e.g., diaryl iodonium (alkyl or aryl) sulfonate and bis-(di-t-butylphenyl)iodonium camphanylsulfonate; aryl (e.g., phenyl or benzyl) triflates and derivatives and analogs thereof, e.g., triphenylsulfonium triflate or bis-(t-butyl phenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethane sulfonates and others; trifluoromethanesulfonate esters of hydroxyimides, .alpha.,.alpha.'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), Chemistry of Materials 3:395. Additional suitable acid generators useful in conjunction with the compositions and methods of the invention will be known to those skilled in the art and/or described in the pertinent literature (see U.S. Pat. No. 6,165,678).

The resist composition may additionally, if necessary or desirable, include customary additives such as dyes, sensitizers, additives used as stabilizers and acid-diffusion controlling agents, coating aids such as surfactants or antifoaming agents, adhesion promoters and plasticizers.

2. Carbon Dioxide Solvent Systems.

Carbon-dioxide solvent systems used to carry out the present invention typically comprise:

(a) carbon dioxide to balance, typically at least 40, 50 60, or 70 percent;

(b) optionally, where desired, from 0, 0.01, 0.1, 0.5, 1 or 2 percent to 5 or 10 percent or more of surfactant;

(c) optionally, where desired, from 0, 0.01, 0.1, 1 or 2 to 30, 40 or 50 percent or more of an organic co-solvent; and (d) optionally, and in some embodiments less preferably, from 0.01, or 0.1 to 2, 5 or 10 percent water (and in other embodiments 0 percent water).

Percentages herein are expressed as percentages by weight unless otherwise indicated.

The composition may be provided as a liquid or supercritical fluid, including cryogenic liquids. Liquid and supercritical carbon dioxide are herein together referred to as "densified" carbon dioxide in accordance with established usage.

The organic co-solvent may be one compound or a mixture of two or more ingredients. The organic co-solvent may be or comprise an alcohol (including diols, triols, etc.), ether, amine, ketone, carbonate, or alkanes, or hydrocarbon (aliphatic or aromatic) The organic co-solvent may be a mixture of compounds, such as mixtures of alkanes as given above, or mixtures of one or more alkanes in combination with additional compounds such as one or more alcohols as described above. (e.g., from 0 or 0.1 to 5% of a C1 to C15 alcohol (including diols, triols, etc.)). Any surfactant can be used to carry out the present invention, including both surfactants that contain a $CO_2$-philic group (such as described in PCT Application WO96/27704 or U.S Pat. No. 5,783,082) linked to a $CO_2$-phobic group (e.g., a lipophilic group) and surfactants that do not contain a $CO_2$-philic group (i.e., surfactants that comprise a hydrophilic group linked to a hydrophobic (typically lipophilic) group). A single surfactant may be used, or a combination of surfactants may be used. Numerous surfactants are known to those skilled in the art. See, e.g., McCutcheon's Volume 1: Emulsifiers & Detergents (1995 North American Edition) (MC Publishing Co., 175 Rock Road, Glen Rock, N.J. 07452). Examples of the major surfactant types that can be used to carry out the present invention include the: alcohols, alkanolamides, alkanolamines, alkylaryl sulfonates, alkylaryl sulfonic acids, alkylbenzenes, amine acetates, amine oxides, amines, sulfonated amines and amides, betaine derivatives, block polymers, carboxylated alcohol or alkylphenol ethoxylates, carboxylic acids and fatty acids, a diphenyl sulfonate derivatives, ethoxylated alcohols, ethoxylated alkylphenols, ethoxylated amines and/or amides, ethoxylated fatty acids, ethoxylated fatty esters and oils, fatty esters, fluorocarbon-based surfactants, glycerol esters, glycol esters, hetocyclic-type products, imidazolines and imidazoline derivatives, isethionates, lanolin-based derivatives, lecithin and lecithin derivatives, lignin and lignin derivatives, maleic or succinic anhydrides, methyl esters, monoglycerides and derivatives, olefin sulfonates, phosphate esters, phosphorous organic derivatives, polyethylene glycols, polymeric (polysaccharides, acrylic acid, and acrylamide) surfactants, propoxylated and ethoxylated fatty acids alcohols or alkyl phenols, protein-based surfactants, quaternary surfactants, sarcosine derivatives, silicone-based surfactants, soaps, sorbitan derivatives, sucrose and glucose esters and derivatives, sulfates and sulfonates of oils and fatty acids, sulfates and sulfonates ethoxylated alkylphenols, sulfates of alcohols, sulfates of ethoxylated alcohols, sulfates of fatty esters, sulfonates of benzene, cumene, toluene and xylene, sulfonates of condensed naphthalenes, sulfonates of dodecyl and tridecylbenzenes, sulfonates of naphthalene and alkyl naphthalene, sulfonates of petroleum, sulfosuccinamates, sulfosuccinates and derivatives, taurates, thio and mercapto derivatives, tridecyl and dodecyl benzene sulfonic acids, etc.

Particular preferred embodiments of solvent systems that may be utilized herein are described in greater detail below.

3. Solvent Systems Containing Polar Fluids.

In one embodiment of the invention, a polar fluid such as water is incorporated into the core of micelles or reverse micelles. Here, the polar fluid is a discrete phase and the carbon dioxide solvent system serves as continuous phase. Such a system, which may be a microemulsion, can be used to, among other things, solubilize and remove polar polymeric materials from light field regions of polymer resists, and particularly to preferentially and/or selectively remove the polar polymeric material from the light field regions when the polarity of those regions has been increased relative to the dark field regions by exposing the light field regions to radiant energy.

In an aspect of the above embodiment, a positive tone image is generated using electron beam lithography so that the exposure of the light field to the incident radiation results in a decrease in molecular weight in the exposed polymer. In this case, the $CO_2$ formulation, which may compose a water-in-$CO_2$ emulsion or microemulsion, selectively or preferentially removes the lower molecular weight polymer exclusively resulting in the positive tone image.

The formation of micelles containing a polar fluid in a carbon dioxide continuous phase is known and can be carried out in accordance with known techniques, including but not limited to those described in U.S. Pat. Nos. 5,158,704 and 5,266,205 to Fulton and Smith, both titled "Supercritical Fluid Reverse Micelle Systems", the disclosures of which are to be incorporated herein by reference in their entirety.

4. Solvent Systems Containing Carbon Dioxide Insoluble Polymers.

In an alternate embodiment of the invention to that described in section 3 above, the cores of the micelles comprise one or more carbon-dioxide insoluble polymers (i.e., polymers that are otherwise insoluble in the carbon dioxide continuous phase). In some embodiments, such a system advantageously avoids the use of water and hence is non-aqueous. Such solvent systems may be employed to selectively or preferentially remove light field regions when there has been a decrease in molecular weight or polymer chain length of the resist in the light field region (thereby making the lower molecular weight polymer preferentially soluble in the carbon dioxide insoluble polymer found in the micelle core). This technique can advantageously be employed in the case where the polymer in the light field is made more polar by the radiant energy. In this case the carbon dioxide insoluble polymer in the micelle would is preferably a hydrophilic polymer. Note in this case that both lower molecular weight and increased polarity in the polymer due to exposure to energy in the light field can lead to removal of the polymer and image formation.

Suitable materials for the formation of polymer cores in such embodiments include, but are not limited to poly(hydoxystyrene), poly(lactic acid), polyethyleneimine, poly(ethylene-co-vinyl acetate-co-methacrylic acid), poly(2-ethyl-2-oxazoline), and mixtures thereof. The solubilization of polymers into other polymers within a carbon dioxide cleaning system is known and described in, among other things, J. DeSimone et al., U.S. Pat. No. 5,783,082; and in J. McClain et al., *Science* 274, 2013, 2049 (1996).

5. Solvent Systems Containing Surfactants.

Still another technique for selectively or preferentially removing a light field region, where the polarity of the light field region has been selectively or preferentially increased relative to the dark field region by radiant energy, is to include surfactants within the carbon dioxide solvent system (e.g., within the same phase as the carbon dioxide) that bond to polar groups within the polymer and thereby selectively or preferentially remove the polymer within the light field region. Suitable surfactants may include those described above and generally comprise a polar group coupled or covalently joined to a $CO_2$-philic or $CO_2$ soluble group. Any suitable $CO_2$ philic group can be used, including fluorine-containing groups, siloxane-containing groups, acetate groups, ether groups, ether-carbonate groups, etc. Surfactants containing $CO_2$-philic groups are known and described in, among other things, J. DeSimone et al., U.S. Pat. No. 5,783,082; and in J. McClain et al., *Science* 274, 2013, 2049 (1996); Jureller et al., U.S. Pat. No. 5,683,977; Jureller et al., U.S. Pat. No. 5,683,473; X. Jia et al., *Langmuir* 18, 683 (2002); and T. Sarbu et al., *Nature* 405, 165 (2000).

6. Lithography Techniques.

In general, photolithography involves the transfer of a design on a mask to a printed image in resist/photoresist material on a semiconductor substrate. There are a number of commonly recognized physical factors that contribute to differences between the design and the printed image. Lithography is well known and the steps thereof in the context of the present invention may be carried out by any suitable technique, including but not limited to those described in *Introduction to Microlithography*, Eds. Thompson et al. (Washington, D.C.: American Chemical Society, 1994), and in U.S. Pat. Nos. 6,383,719; 6,162,577; 5,780,188; 5,736,281; and 5,532,090.

In some embodiments, the process for generating a resist image on a substrate comprises the steps of: (a) coating a substrate with a film comprising the resist composition; (b) imagewise exposing the film to radiation/radiant energy; and (c) developing the image with a carbon dioxide solvent system as described herein (i.e., so that light-field regions are selectively or preferentially removed). The first step involves coating the substrate with a film comprising the resist composition dissolved in a suitable solvent. Suitable substrates include but are not limited to those described above. The substrate may or may not be coated with an organic anti-reflective layer prior to deposition of the resist composition. Preferably, the surface of the substrate is cleaned before the film is deposited thereon. The film can be coated on the substrate using art-known techniques such as spin coating, spray coating, or doctor blading. In some embodiments, before the film has been exposed to radiation, the film is heated to an elevated temperature of about 90–150° C. for a short period of time, typically on the order of about 1 minute. In some embodiments the dried film may have a thickness of about 0.2–5.0 microns, or more particularly about 0.3–1.2 microns. In the second step of the process, the film is imagewise exposed to x-ray, electron beam, ultraviolet radiation/light (including deep ultraviolet light and extreme ultraviolet (EUV) light), or other source of radiant energy, preferably ultraviolet radiation/light, at a wavelength of for example about 13–250 nm. The radiation is sufficient to initiate a chemical reaction in the resist film to increase the polarity thereof and/or decrease the molecular weight thereof (e.g., by generating free acid which with heating causes cleavage of an acid-cleavable ester substituent and formation of the corresponding acid, by formation of an acid group on the polymer, etc.). The third step involves development of the image with a carbon dioxide solvent system as described above, utilizing the solvent systems described herein in a manner that preferentially removes the light field regions.

Dense phase carbon dioxide, liquid and supercritical $CO_2$ phases, have solvent properties that are significantly 'tuneable' over a large range of pressures and temperatures. Whereas conventional solvents and water may have density changes of <5% over a temperature range of 20° C., the density of liquid and supercritical $CO_2$ can change dramatically over the same range (e.g., 60% between 35° C. and 55° C. at 125 bar). The changes in fluid density as a function of pressure can also be significant as the pressure of supercritical $CO_2$ changes. At 55° C., the density of supercritical $CO_2$ fluid changes 125% between 100 and 200 bar. While fluid density does not completely account for the solubility or phase behavior properties of molecules in $CO_2$ fluid, it is a generally good indicator.

The substantial variance of fluid density over a relatively narrow range of T and P, provides process control factors not available to conventional fluids. The process control factors can be used to manipulate the phase behavior of a given material dissolved, dispersed, suspended, or otherwise carried in $CO_2$ fluid. This controlled manipulation can be very useful in the current invention. Consider the case where aqueous a water-in-$CO_2$ microemulsion is to be generated in supercritical $CO_2$ and used as a fluid medium for the development of light-field regions of an exposed positive tone photoresist. The polar groups generated by acid hydrolysis will have stronger affinity for the dispersed aqueous microdomain than the non-hydrolyzed dark-field regions unexposed to incident light. Now consider changes in pressure or temperature result in changes in the phase behavior of the microemulsion. At a given density in which an inverse water-in-$CO_2$ microemulsion is stable an increase in temperature or decrease in pressure would result in a lowering of the fluid density and at a certain point a destabilization of the microemulsion. This would dramatically affect the transport and partitioning of materials in the continuous phase and thus the dissolution of polar materials in the system. Alternatively, stabile water-in-$CO_2$ microemulsions can be deformed above an upper critical density, such as by increasing pressure, also affecting materials transport and partitioning.

The present invention is explained in greater detail in the following non-limiting Examples.

EXAMPLE 1

A chemically amplified positive tone photoresist with photoacid generator is coated onto a substrate. The substrate is then exposed to incident light through a pattern transfer mask and then baked to complete hydrolysis of chemically active groups. The pattern is then developed in a $CO_2$ system in the following manner. The substrate is placed in a pressure vessel heated to 45° C. Carbon dioxide is added to the pressure vessel to 200 bar. At this pressure, a 3:1:1 mixture of t-butyl alcohol, N-methylethanolamine, and 4-hydroxybutyric acid gamma-lactone is added to the system to a concentration of 10% by weight. While maintaining the system as near as possible to a fixed temperature of 45° C., the pressure of the system is cycled between 200 and 125 bar at a rate of 1 cycle per second. After 10 minutes, the fluid in the system is rinsed with pure $CO_2$ maintaining a pressure of at least 125 bar, for 5 fluid turnovers. The chamber is then vented and the substrate removed to yield the patterned substrate.

EXAMPLE 2

A chemically amplified positive tone photoresist with photoacid generator is coated onto a substrate. The substrate is then exposed to incident light through a pattern transfer mask and then baked to complete hydrolysis of chemically active groups. The pattern is then developed in a $CO_2$ system in the following manner. The substrate is placed in a pressure vessel heated to 40° C. Carbon dioxide containing 2% by weight of a $CO_2$-philic/hydrophilic surfactant such as sodium bis(1,1,2,2-tetrahydroperfluoroalkyl) phosphate is added to the vessel to a pressure of 150 bar. Then 1.5% by weight of a 4:1 mixture of water and N-methylethanolamine is added to the system. After 10 minutes at 40° C. and 150 bar, the system is rinsed with 5 fluid turns of pure $CO_2$. The chamber is then vented and the substrate removed to yield the patterned substrate.

EXAMPLE 3

A chemically amplified positive tone photoresist with photoacid generator is coated onto a substrate. The substrate is then exposed to incident light through a pattern transfer mask and then baked to complete hydrolysis of chemically active groups. The pattern is then developed in a $CO_2$ system in the following manner. The substrate is placed in a pressure vessel heated to 40° C. along with enough of a $CO_2$-philic/hydrophilic polymer, such as a block copolymer consisting of a 18k PFOA segment and a partially hydrolyzed 5 k poly(4-tert-butoxy styrene) segment, to make a 3% by weight polymer dispersion in $CO_2$. Carbon dioxide and N-methylethanolamine (98/2) is then added to 200 bar. After 10 minutes at 40° C. and 200 bar, the system is rinsed with 5 fluid turns of pure $CO_2$. The chamber is then vented and the substrate removed to yield the patterned substrate.

The foregoing is illustrative of the present invention, and is not to be construed as limiting thereof. The invention is defined by the following claims, with equivalents of the claims to be included therein.

That which is claimed is:

1. A method for carrying out positive tone lithography with a carbon dioxide development system, comprising the steps of:
   (a) providing a substrate, said substrate having a polymer resist layer formed thereon;
   (b) exposing at least one portion of said polymer resist layer to radiant energy to increase the polarity of said exposed portion and thereby form at least one light field region in said polymer resist layer while concurrently maintaining at least one portion of said polymer layer unexposed to said radiant energy to thereby form at least one dark field region in said polymer resist layer;
   (c) contacting said polymer resist layer to a carbon dioxide solvent system, said solvent system comprising a polar group, under conditions in which said at least one light field region is preferentially removed from said substrate by said carbon dioxide solvent system as compared to said at least one dark field region;
   wherein said carbon dioxide solvent system comprises a continuous phase and a discrete phase, said continuous phase comprising carbon dioxide and said discrete phase comprising a polar fluid, with said at least one light field region being preferentially soluble in said polar fluid as compared to said at least one dark field region;
   and wherein said solvent system further comprises a surfactant.

2. The method according to claim 1, wherein said carbon dioxide solvent system is an aqueous system containing not more than 10 percent water by weight.

3. The method according to claim 1, wherein said carbon dioxide solvent system is a non-aqueous system.

4. The method according to claim 1, wherein said carbon dioxide solvent system is a liquid.

5. The method according to claim 1, wherein said carbon dioxide solvent system is a supercritical fluid.

6. The method according to claim 1, wherein said substrate is a microelectronic substrate.

7. The method according to claim 1, wherein said radiant energy is light.

8. The method according to claim 1, wherein said solvent system comprises a microemulsion.

9. The method according to claim 1, wherein said discrete phase comprises reverse micelles.

10. The method according to claim 1, wherein said carbon dioxide solvent system comprises a continuous phase and a discrete phase, said continuous phase comprising carbon dioxide and said discrete phase comprising a carbon-dioxide insoluble polymer, with said at least one light field region being preferentially soluble in said carbon-dioxide insoluble polymer as compared to said at least one dark field region.

11. The method according to claim 10, wherein said solvent system comprises a microemulsion.

12. The method according to claim 10, wherein said solvent system further comprises a surfactant.

13. The method according to claim 10, wherein said discrete phase comprises reverse micelles.

14. The method according to claim 1, wherein said carbon dioxide solvent system further comprises a surfactant, said surfactant comprising a polar group and a $CO_2$-philic group, with said light field region containing resist polar groups that bind to said surfactant polar groups so that said at least one light field region is preferentially soluble in said solvent system as compared to said at least one dark field region.

15. The method according to claim 1, wherein said carbon dioxide solvent system further comprises a surfactant, said surfactant comprising a polar group and a $CO_2$-philic group, with said light field region containing low molecular weight polymer species that bind to said surfactant polar groups so that said at least one light field region is preferentially soluble in said solvent system as compared to said at least one dark field region.

16. The method of claim 1, wherein said solvent system further comprises a co-solvent.

17. The method of claim 16, wherein said co-solvent is an alcohol.

18. A method for carrying out light field lithography with a carbon dioxide solvent system, comprising the steps of:
   (a) providing a substrate, said substrate having a polymer resist layer formed thereon;
   (b) exposing at least one portion of said polymer resist layer to radiant energy to decrease the molecular weight of the exposed portion and thereby form at least one light field region in said polymer resist layer while concurrently maintaining at least one portion of said polymer layer unexposed to said radiant energy to thereby form at least one dark field region in said polymer resist layer;

(c) contacting said polymer resist layer to a carbon dioxide solvent system, said solvent system comprising a polar group, under conditions in which said at least one light field region is preferentially removed from said substrate by said carbon dioxide solvent system as compared to said at least one dark field region;

wherein said carbon dioxide solvent system comprises a continuous phase and a discrete phase, said continuous phase comprising carbon dioxide and said discrete phase comprising a polar fluid, with said at least one light field region being preferentially soluble in said polar fluid as compared to said at least one dark field region;

and wherein said solvent system further comprises a surfactant.

19. The method according to claim 18, wherein said carbon dioxide solvent system is an aqueous system containing not more than 10 percent water by weight.

20. The method according to claim 18, wherein said carbon dioxide solvent system is a non-aqueous system.

21. The method according to claim 18, wherein said carbon dioxide solvent system is a liquid.

22. The method according to claim 18, wherein said carbon dioxide solvent system is a supercritical fluid.

23. The method according to claim 18, wherein said substrate is a microelectronic substrate.

24. The method according to claim 18, wherein said radiant energy is light.

25. The method according to claim 18, wherein said solvent system comprises a microemulsion.

26. The method according to claim 18, wherein said discrete phase comprises reverse micelles.

27. The method according to claim 18, wherein said carbon dioxide solvent system comprises a continuous phase and a discrete phase, said continuous phase comprising carbon dioxide and said discrete phase comprising a carbon-dioxide insoluble polymer, with said at least one light field region being preferentially soluble in said carbon-dioxide insoluble polymer as compared to said at least one dark field region.

28. The method according to claim 27, wherein said solvent system comprises a microemulsion.

29. The method according to claim 27, wherein said solvent system further comprises a surfactant.

30. The method according to claim 27, wherein said discrete phase comprises reverse micelles.

31. The method of claim 18, wherein said solvent system further comprises a co-solvent.

32. The method of claim 31, wherein said co-solvent is an alcohol.

* * * * *